Jan. 26, 1960

J. T. MAUPIN 2,922,897

TRANSISTOR CIRCUIT

Filed Jan. 30, 1956

INVENTOR.
JOSEPH T. MAUPIN

BY Frederick E. Lange

ATTORNEY 2,922,897
Patented Jan. 26, 1960

2,922,897

TRANSISTOR CIRCUIT

Joseph T. Maupin, Deep Haven, Minn., assignor to Minneapolis-Honeywell Regulator Company, Minneapolis, Minn., a corporation of Delaware Application January 30, 1956, Serial No. 562,266
6 Claims. (Cl. 307—88.5)

This invention relates to improvements in controlling transistor characteristics in response to input signal conditions and is more specifically concerned with such control as a junction type tetrode transistor having two connections to the base area on points on opposite sides of the emitter junction.

An object of this invention is to provide circuitry for use with a junction type tetrode transistor for controlling and modifying the inherent amplification characteristics of the transistor.

Figure 1:
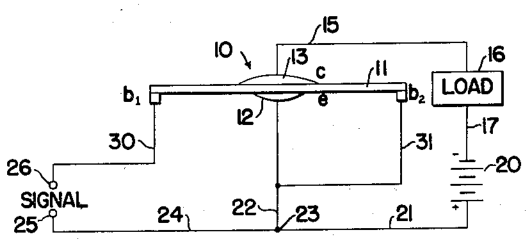
Figure 4:
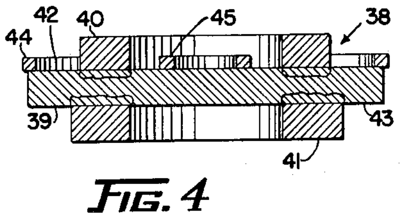
Figures 2, 3:
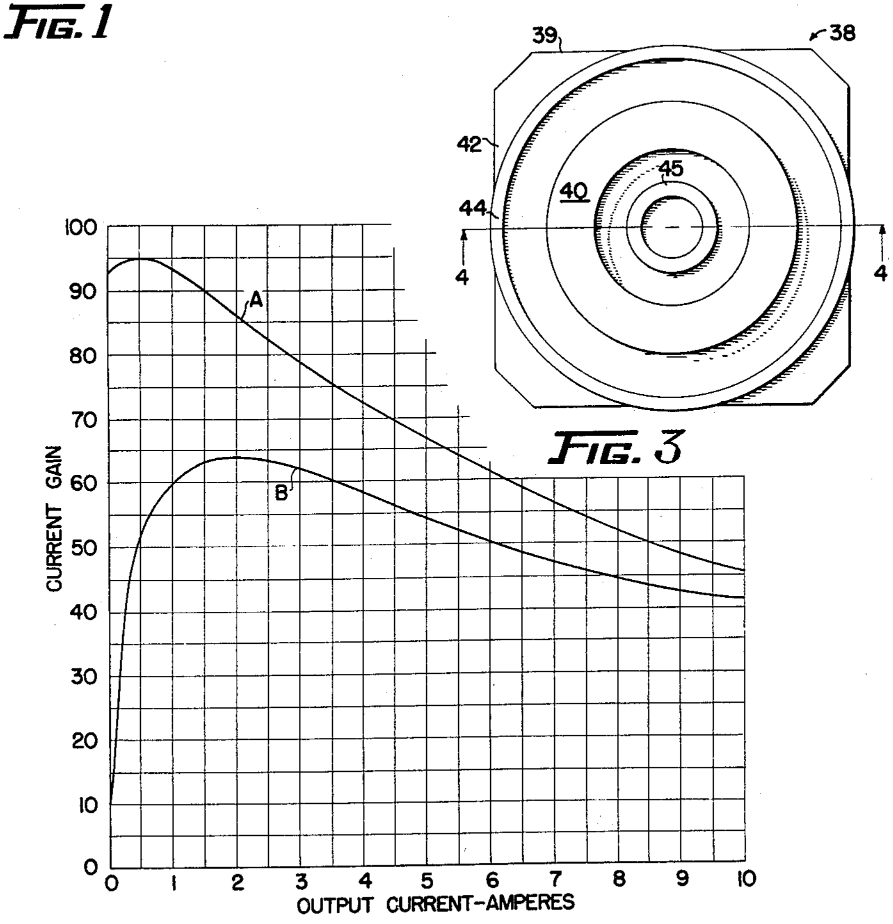

A more specific object of this invention is to control the current amplification characteristics of the junction type tetrode transistor in accordance with the applied signal by a particular circuit configuration. These and other objects of the invention will be understood upon consideration of the accompanying specification, claims, and drawings of which:

Figure 1 is a schematic representation of the circuitry of an embodiment of the invention, Figure 2 is a graphical representation of the transistor amplification characteristics under various conditions, and Figures 3 and 4 disclose the construction of a preferred type of transistor for use in this invention, Figure 3 being a top plan view of the device, and Figure 4 being a vertical sectional view taken along the lines and in the direction of the arrows 4—4 of Figure 3.

Referring now to Figure 1, there is disclosed a junction type tetrode transistor 10, which has been disclosed as a diffused junction type transistor, preferably of the type shown in my copending application entitled "Semi-Conductor Devices," Serial No. 556,210, filed December 29, 1955, and assigned to the same assignee as the present invention. Figures 3 and 4 disclose an embodiment of the transistor device of my copending application. As can be seen by reference to these figures the collector and emitter electrodes 41 and 40 are annular in form, and the base connections *b*1 and *b*2, 44 and 45, are likewise annular, *b*1 being located around the emitter annulus and base connection *b*2 being located within the circle of the emitter. It is to be understood, however, that any other suitable junction transistor may be used. The transistor 10 includes a wafer of semi-conductive material 11 which has two low resistance base electrode connections *b*1 and *b*2 attached thereto. The transistor also has an emitter electrode 12 and a collector electrode 13. It will be noted that the base connections *b*1 and *b*2 are so positioned on the base 11 that the emitter and collector junctions are positioned between them. A resistive current path exists between the two base connections with the majority of the base resistance in the bridge area between the collector and emitter junctions.

The collector electrode 13 is electrically connected by a conductor 15 to one terminal of a suitable load device 16. A conductor 17 connects the other terminal of load device 16 to one terminal of a source of electrical energy 20, shown here as a battery. The other terminal of battery 20 is connected by conductors 21 and 22 to the emitter 12. A junction 23 connects conductors 21 and 22, and the junction 23 is connected by a conductor 24 to an input terminal 25, which is one of a pair of input terminals 25 and 26. The input terminals are connected to a suitable source of signal input potential, not shown. Input terminal 26 is connected to base electrode *b*1 by a conductor 30. Base electrode *b*2 is directly connected to emitter 12 by conductors 31 and 22.

Attention is now directed to Figures 3 and 4 wherein there is shown a modification of a device which is particularly applicable to the features of the present invention. Thus there is shown a transistor generally designated 38 which includes a semi-conductive body 39 having a pair of junction electrodes 40 and 41 situated in oppositely disposed relationship on a pair of parallelly disposed surfaces 42 and 43 respectively. The emitter electrode 40 is situated between a pair of low resistance base electrode connections 44 and 45 and is preferably somewhat smaller in width dimension than is the corresponding collector electrode 41. Details of this device are more clearly set forth in my copending application entitled "Semi-Conductor Devices" previously referred to. It has been found that good amplification, gain, and control characteristics are obtained when a device such as is shown in Figures 3 and 4 is utilized. It will be appreciated that transistor tetrode 10 may very well represent a partial view, i.e., the right or left of transistor 38.

*Operation*

The circuitry shown in Figure 1 has for its specific purpose the modifying of the transistor amplification characteristic to improve the operation of the transistor for switching applications. Referring momentarily to Figure 2, curve A as shown is representative of the inherent current gain, or ratio of output current to input current, of a junction power transistor such as is disclosed in my copending application, previously referred to. It will be noted, by referring to curve A, that the transistor gain curve starts relatively high and rises slightly to peak at a relatively low transistor collector output current of about 0.5 ampere and then the gain continuously drops off as the output current increases. For certain applications, such as in servo systems, such as gain curve is desirable, however, for switching applications it is desirable that the transistor gain at very low signal levels approach zero as nearly as possible.

Some of the characteristics of foremost interest in an electronic switching device are the "off" impedance, the "on" impedance, the input power required to operate the switch, and the switching time from "on" to "off." The "off" impedance of a common emitter transistor amplifier switch is inversely proportional to the basic collector junction leakage current, and the extent to which it is amplified by the gain of the transistor. It is desirable therefore in order to achieve high stable values of "off" impedance to have low leakage and low current gain in the transistor for the "off" condition. Unfortunately, however, as can be seen from curve A of Figure 2, the gain of a triode junction transistor is at or near its peak value when the collector current is very low.

One relatively simple mode of operation for a power tetrode transistor which appears attractive for switching purposes is illustrated in Figure 1. The circuit is shown in the conventional common emitter configuration in which the emitter electrode is common to the input and output circuits. The circuit signal input terminals 25 and 26 are connected, respectively, to the emitter and base electrode *b*1. The collector and emitter electrodes 13 and 12 form the transistor output electrodes and are connected to the load device 16 and battery 20. This circuit has the second base terminal *b*2 directly connected to the emitter 12. The resulting performance is such that the magnitude and stability of the "off" impedance approaches that of the common base triode connection, whereas the power sensitivity in the "on" condition approaches that of the common emitter connection. This is a highly desirable combination for switching purposes.

To explain the operation of this circuit let us consider the "off" condition when the input current from terminals 25 and 26 is zero. There is a low resistance path through base connection *b*2 for the collector junction leakage current, which path may be traced from the positive terminal of battery 20 to conductors 21, 22 and 31, to base electrode *b*2, through the semi-conductive body 11, through the collector junction in the reverse direction to collector 13, and then returning to the battery through conductor 15, load 16 and conductor 17. Due to the low resistance path through the base electrode *b*2 there is little tendency for the leakage current to turn on the emitter. Also when the first small increment of input signal is applied to input terminals 25 and 26, it will flow nearly entirely in a traverse direction through the base material from base electrode *b*2 to the base electrode *b*1. This is due to the high forward resistance of the emitter junction when small voltages exist across the junction. The transverse current contributes nothing to the output current and the gain of the unit is substantially zero. The semi-conductive body 11 is of a resistive nature and the input signal establishes a voltage gradient between base connection *b*2 and *b*1, such that base electrode *b*1 is at a less positive potential than is base electrode *b*2. As the input signal is increased, the voltage gradient increases and the emitter is turned on, or in more specific terms when the emitter-base potential is sufficiently increased by the signal, minority carriers flow across the junction from the emitter to the base region and these minority carriers are subsequently collected by the collector electrode, whereupon the transistor tetrode gain rises rapidly. The heart of the invention is that the emitter is by-passed to both signal currents and collector leakage current at low signal current levels. The curve of transistor gain for this circuit is shown clearly in curve B of Figure 2. It will be noted that the gain at high conductor currents approaches that of the conventional triode transistor circuit as shown in curve A. Another advantage of the circuit of Figure 1 is that the turn-off time or "fall time" of the transistor switch with base electrode *b*2 shorted to emitter 12 is appreciably less than that for the comparable triode. The fall time is defined as the time required for the output current to decay by 90% of its maximum amplitude after the signal is removed. If desirable the fall time may be reduced even further by the substitution of an inductive element for the conductor 31, the inductive action producing a bias when the signal is removed thereby significantly and further reducing the switching time of the device.

Many changes and modifications of this invention will undoubtedly occur to those who are skilled in the art and I therefore wish it to be understood that I intend to be limited by the scope of the appended claims and not by the specific embodiment of my invention which is disclosed herein for the purpose of illustration only.

I claim:

1. Transistor amplifying apparatus comprising: a tetrode junction transistor having a semiconductive body and including a collector electrode, an emitter electrode and first and second base electrodes, said base electrodes being positioned on said body on opposite sides of said emitted electrode, a resistive path existing between said base electrodes transversely through said semiconductive body; passive connective means containing no source of potential directly uniting together electrically said second base electrode to said emitter electrode; a pair of input terminals connected to a source of signal current; output circuit means including a source of potential, said output circuit means being connected to said collector and emitter electrodes; and circuit means connecting one of said input terminals to said first base electrode and connecting the other of said input terminals to said emitter and second base electrodes, said signal current at relatively low magnitudes flowing between said base electrodes through said resistive path whereby the gain of the transistor is maintained at a minimum for low signal currents.

2. Circuit apparatus for modifying the current gain characteristic of a transistor comprising: a junction tetrode transistor having a semiconductive body and including a plurality of electrodes comprising a collector electrode, an emitter electrode, and first and second base electrodes; means connecting a source of signal current to said first base and emitter electrodes; a source of potential; load means; means connecting said potential source and said load means intermediate said emitter and collector electrodes; and passive connecting means containing no source of potential directly shorting together said second base electrode to said emitter electrode whereby a relatively low impedance path is provided from said potential source to said collector junction for the collector leakage current so that the collector leakage current path does not include said emitter electrode.

3. Transistor apparatus comprising: a junction tetrode transistor having a semiconductive body and including a collector electrode, an emitter electrode and first and second base electrodes, said base electrodes being located on opposite sides of said emitter electrode; passive connection means containing no source of potential directly electrically uniting said second base electrode to said emitter electrode; input means connecting a source of signal current intermediate said emitter and first base electrode; a source of potential; and output means including said potential source connected to said collector and emitter electrodes.

4. Circuit apparatus for modifying the current gain characteristics of a transistor comprising; a junction type tetrode transistor having a semiconductive body and having a plurality of electrodes on said body including a collector electrode, an emitter electrode, and first and second base electrodes, said emitter and collector electrodes making rectifying junction with said body said base electrode making ohmic contact with said body and being positioned on opposite sides of said emitter electrode, a resistive current path existing between said base electrodes transversally through said body; passive connection means containing no source of potential directly interconnecting said second base electrode to said emitter electrode; a pair of input terminals, said input terminals being energized from a source of alternating current signal of variable magnitude; means connecting one of said input terminals to said first base electrode and connecting the other of said input terminals to said second base electrode and said emitter electrode, whereby said source of signal current is applied intermediate said base electrodes and intermediate said first base electrode and said emitter electrode; output circuit means connected to said transistor collector and emitter electrodes, the output current in said output means being proportional to the signal current flowing in said emitter junction; said rectifying emitter junction requiring a predetermned potential to exist between said emitter and said semiconductive body before any substantal current flows therethrough, whereupon signal currents of relatively small magnitude flow through said transverse resistive current path between said base electrodes developing a potential gradient across said semiconductive body between said base electrodes, said output current remaining substantially cutoff until said signal magnitude is increased to exceed said predetermined potential across said emitter junction.

5. Circuit apparatus for modifying the current gain characteristic of a transistor comprising: a junction type tetrode transistor having a semiconductive body and having a plurality of electrodes including a collector electrode, an emitter electrode and first and second base electrodes positioned on opposite sides of said emitter electrode, each of said electrodes being parallelly disposed and having a substantially annular configuration; a resistive current path existing in said semiconductive body between said base electrodes; means connecting a source of signal current intermediate said first base electrode and said emitter electrode; a source of potential, load means; means connecting said potential source and said load means intermediate said collector and emitter electrodes; and conductive means containing no source of potential directly uniting together electrically said second base electrode to said emitter electrode whereby a low impedance path is provided to bypass said emitter from said potential source to said collector junction for the collector leakage current so that the collector leakage current path does not include said emitter electrode, and whereby at low signal magnitudes said signal current bypasses said emitter and flows substantially exclusively in said resistive path transversely through said semiconductive body between said base electrodes, said transverse current reducing the amplification characteristic of said transistor.

6. Transistor circuit apparatus for modifying the current amplification characteristic of a transistor comprising: a junction tetrode transistor having a semiconductive body and having a plurality of electrodes including a collector electrode, an emitter electrode and first and second base electrodes in contact with said body, said emitter and base electrodes each being parallelly disposed on said body and having a substantially annular configuration with one base electrode being positioned on each side of said emitter electrode, said collector and emitter electrodes making a rectifying junction with said semiconductive body and said base electrodes making ohmic contact with said body; a resistive current path existing between said base electrodes transversally through said semiconductive body; conductive means containing no source of potental directly uniting together electrically said second base electrode to said emitter electrode; a pair of input terminals connected to a source of signal current of variable magnitude; output circuit means including a source of potential, said means being connected to said collector and emitter electrodes; and circuit means connecting one of said input terminals to said first base electrode and connecting the other of said input terminals to said emitter electrode and said second base electrode, said second base electrode circuit providing a low impedance shunt to said emitter junction whereby said signal current at relatively small magnitudes bypasses said emitter and flows between said base electrodes through said transverse resistive path, said transverse current reducing the amplification of said transistor.

References Cited in the file of this patent

UNITED STATES PATENTS

| | | |
|---|---|---|
| 2,600,500 | Haynes et al. | June 17, 1952 |
| 2,632,146 | Kock | Mar. 17, 1953 |
| 2,701,302 | Giacoletto | Feb. 1, 1955 |
| 2,747,111 | Koch | May 22, 1956 |
| 2,754,431 | Johnson | July 10, 1956 |